US009535721B2

(12) United States Patent
Ammon

(10) Patent No.: US 9,535,721 B2
(45) Date of Patent: Jan. 3, 2017

(54) METHOD AND APPARATUS FOR OPTIMIZED BULK CONSTRAINT REMOVAL WITH ACCUMULATION

(71) Applicant: Apple Inc., Cupertino, CA (US)

(72) Inventor: Peter C. Ammon, San Jose, CA (US)

(73) Assignee: Apple Inc., Cupertino, CA (US)

( * ) Notice: Subject to any disclaimer, the term of this patent is extended or adjusted under 35 U.S.C. 154(b) by 419 days.

(21) Appl. No.: 13/919,816

(22) Filed: Jun. 17, 2013

(65) Prior Publication Data

US 2014/0372917 A1    Dec. 18, 2014

(51) Int. Cl.
*G06F 3/0481* (2013.01)
*G06F 9/44* (2006.01)
*G06F 17/50* (2006.01)

(52) U.S. Cl.
CPC ............... *G06F 9/4443* (2013.01); *G06F 8/38* (2013.01); *G06F 17/50* (2013.01)

(58) Field of Classification Search
CPC .................................................. G06F 3/0481
USPC ......................................................... 715/765
See application file for complete search history.

(56) References Cited

U.S. PATENT DOCUMENTS

| | | | | |
|---|---|---|---|---|
| 5,481,748 A | * | 1/1996 | Cunto ................... | G06F 7/5525 707/999.007 |
| 5,517,428 A | * | 5/1996 | Williams ............... | G06F 17/509 700/83 |
| 5,557,367 A | * | 9/1996 | Yang ...................... | G03G 15/50 399/14 |
| 6,321,135 B1 | * | 11/2001 | Asgeirsson ............ | B07C 5/38 198/358 |
| 7,546,578 B2 | * | 6/2009 | Yang ....................... | G06F 8/10 717/108 |
| 7,644,356 B2 | * | 1/2010 | Atkins .................... | G06T 11/60 715/243 |
| 8,291,314 B2 | * | 10/2012 | Atkins .................... | G09G 5/14 715/234 |

(Continued)

OTHER PUBLICATIONS

Badros, Greg J., et al., "The Cassowary Linear Arithmetic Constraint Solving Algorithm: Interface and Implementation", Technical Report UW-CSE-98-06-04, Department of Computer Science and Engineering, University of Washington, Seattle, WA, (Jun. 29, 1998), pp. 1-31.

(Continued)

*Primary Examiner* — Reza Nabi
(74) *Attorney, Agent, or Firm* — Blakely, Sokoloff, Taylor & Zafman LLP

(57) ABSTRACT

A method and apparatus of a device that removes constraints in solving a mathematical programming problem is described. The device identifies a plurality of constraints for bulk removal by postponing execution of constraint removal requests. The device further sorts the plurality of constraints based on a set of criteria to put the plurality of constraints in a sorted order. To sort the plurality of constraints based on the set of criteria, the device determines, for each identified constraint, the number of equations containing the constraint in the mathematical programming problem. The device further sorts the plurality of constraints based on the number of equations determined for each constraint. The device performs bulk constraint removal on the plurality of constraints based on the sorted order.

26 Claims, 13 Drawing Sheets

(56) References Cited

U.S. PATENT DOCUMENTS

| | | | | |
|---|---|---|---|---|
| 8,311,878 B2* | 11/2012 | Subramanian | G06Q 10/04 | 705/7.11 |
| 8,862,986 B2* | 10/2014 | Atkins | G06F 9/4443 | 715/243 |
| 9,002,805 B1* | 4/2015 | Barber | G06F 17/30303 | 707/692 |
| 9,052,942 B1* | 6/2015 | Barber | G06F 9/4843 | |
| 2004/0085345 A1* | 5/2004 | Galou | H04L 41/044 | 715/734 |
| 2004/0243945 A1* | 12/2004 | Benhase | G06F 3/0482 | 715/853 |
| 2006/0179405 A1* | 8/2006 | Chao | G06F 17/248 | 715/209 |
| 2006/0200759 A1* | 9/2006 | Agrawala | G06F 17/211 | 715/209 |
| 2006/0224423 A1* | 10/2006 | Sun | G06Q 10/04 | 705/7.12 |
| 2006/0279566 A1* | 12/2006 | Atkins | G06T 11/60 | 345/418 |
| 2007/0214142 A1* | 9/2007 | Goyal | G06Q 30/02 | |
| 2007/0214381 A1* | 9/2007 | Goyal | G06F 11/0715 | 714/5.1 |
| 2007/0214457 A1* | 9/2007 | Goyal | G06F 17/30171 | 718/101 |
| 2008/0120336 A1* | 5/2008 | Bergman | G06F 17/30533 | |
| 2008/0243766 A1* | 10/2008 | Nowlan | G06Q 20/102 | |
| 2009/0031259 A1* | 1/2009 | Gray | G06F 17/5068 | 716/132 |
| 2009/0037850 A1* | 2/2009 | Gray | G06F 17/5081 | 716/135 |
| 2009/0062969 A1* | 3/2009 | Chandra | G06Q 10/06 | 700/291 |
| 2010/0153892 A1* | 6/2010 | Gray | G06F 17/5068 | 716/103 |
| 2010/0275152 A1* | 10/2010 | Atkins | G06F 17/212 | 715/788 |
| 2011/0071857 A1* | 3/2011 | Malov | G06Q 40/06 | 705/4 |
| 2011/0264704 A1* | 10/2011 | Mehra | G06F 17/30578 | 707/802 |
| 2013/0085660 A1* | 4/2013 | Wang | G08G 5/0043 | 701/120 |
| 2013/0317755 A1* | 11/2013 | Mishra | G06F 19/22 | 702/20 |
| 2013/0332869 A1* | 12/2013 | Ferry | G06F 8/38 | 715/765 |
| 2014/0379722 A1* | 12/2014 | Mysur | G06F 17/30203 | 707/740 |
| 2015/0031406 A1* | 1/2015 | Fouad | H04W 16/10 | 455/509 |

OTHER PUBLICATIONS

Kasana, H. S., et al., "Grouping algorithm for linear goal programming problems", Asia-Pacific Journal of Operational Research; vol. 20, Issue 2, Abstract, (Nov. 2003), 191-220.

* cited by examiner

METHOD AND APPARATUS FOR OPTIMIZED BULK CONSTRAINT REMOVAL WITH ACCUMULATION

FIELD OF INVENTION

This invention relates generally to optimization and more particularly to methods and apparatus for constraint removal in mathematical optimization.

BACKGROUND OF THE INVENTION

Mathematical programming, or mathematical optimization, is the selection of a best element (with regard to some criteria) from some set of available alternatives. In the simplest case, an optimization problem consists of maximizing or minimizing a real function by systematically choosing input values from within an allowed set and computing the value of the function. More generally, optimization includes finding "best available" values of some objective function given a defined domain. The domain is often specified by a set of constraints, which are equalities or inequalities that the members of the domain have to satisfy.

Convex programming is one kind of mathematical programming that studies the case when the objective function is convex (minimization) or concave (maximization) and the constraint set is convex. This can be viewed as a particular case of nonlinear programming or as generalization of linear or convex quadratic programming. An important characteristic of convex programming is that a local optimum of a convex programming problem must be a global optimum. Therefore, convex programming guarantees the achievement of globally optimal solutions. Linear programming (LP) is a type of convex programming that studies the case in which the objective function is linear and the set of constraints is specified using only linear equalities and inequalities.

In mathematical optimization, the simplex algorithm (or simplex method) is a popular algorithm for solving linear programming problems, where there may be tens of thousands of constraints. The simplex method takes constraints, converts inequality constraints into equality constraints, and enters them into a tableau, which is a matrix representation whose rows initially correspond to the constraints. It then performs pivots on the tableau, which are a form of Gaussian elimination. To perform a pivot on a row, it solves for one of its variables, and then substitutes the resulting expression for that variable into the other rows.

The incremental simplex method is a modification of the simplex algorithm that starts with an existing solution to an existing linear programming problem, and then adds, removes, or modifies one or more constraints of the existing linear programming problem to produce a new problem, and arrives at a solution to the new problem more quickly than if it re-solved the new problem from scratch. It is called incremental, because small changes to the set of constraints can be handled with a proportionally small amount of additional work.

In the incremental simplex method, each constraint is given a special variable called a marker which is only ever present in that constraint. After pivots, the marker may appear in multiple rows in the tableau, which means the constraints have been "mixed in" to each other. To remove a constraint, it is first necessary to undo the pivoting operations, so the row once again reflects that constraint in its original form. This isolates the effects of the constraint into a single row. The row can then be removed from the tableau. Because of the undoing of the pivoting operations, the removal of a constraint can be computationally expensive.

The incremental simplex method is used to solve many different linear programming problems, some of which involves tens of thousands of constraints and the constraints are constantly changing. For example, the incremental simplex method can be used to compute the optimal layout of user interface (UI) controls of a graphical user interface (GUI) within a window or screen, where there are many constraints regarding the positions of the controls and these constraints are constantly changing as a user interacting with the GUI. In order to maintain a high level of responsiveness to user interactions, techniques for allowing more efficient and quicker removal of constraints are desirable.

SUMMARY OF THE DESCRIPTION

A method and apparatus of a device that removes constraints in solving a mathematical programming problem is described. In an exemplary embodiment, the device identifies a plurality of constraints for bulk removal. The device further sorts the plurality of constraints based on a set of criteria to put the plurality of constraints in a sorted order. The device performs bulk constraint removal on the plurality of constraints based on the sorted order.

To sort the plurality of constraints based on the set of criteria, the device determines, for each identified constraint, the number of equations containing the constraint in the mathematical programming problem. The device further sorts the plurality of constraints based on the number of equations containing each constraint. In the same embodiment, the sorted order is a non-decreasing order. In order to determine the number of equations containing the constraint in the mathematical programming problem, the device of one embodiment identifies a marker for the constraint and determines the number of equations containing the marker in the mathematical programming problem. In another embodiment, the device determines, for each identified constraint, a time at which the constraint was added into the mathematical programming problem. The device further sorts the plurality of constraints based on the time at which the constraint was added. In the same embodiment, the sorted order is a reverse chronicle order.

In one embodiment, the plurality of constraints are partially sorted as the sorting of the plurality of constraints stops after a pre-defined number of iterations or a pre-defined amount of time. The partially sorted order is an intermediate result of the sorting.

In order to perform bulk constraint removal, the device of one embodiment removes a set of constraints from the plurality of constraints based on the sorted order. The device further re-sorts the remaining constraints of the plurality of constraints based on the set of criteria to put the remaining constraints in an updated sorted order. The device performs bulk constraint removal on the remaining constraints based on the updated sorted order. In one embodiment, the re-sorting of the remaining constraints uses merge sort.

In one embodiment, the device divides the plurality of constraints into a plurality of disjoint sets, where constraints in a disjoint set do not appear in the same equation with constraints in any other disjoint set. The device further removes the plurality of disjoint sets in parallel.

In order to identify the plurality of constraints for bulk removal, the device of one embodiment accumulates constraint removal requests by postponing execution of the constraint removal requests. The device further identifies constraints corresponding to the accumulated constraint removal requests for bulk removal when a query solution request, a constraint addition request, or a constraint modification request is received.

In one embodiment, the device receives a constraint removal request and determines whether the received constraint removal request satisfies a set of accumulation criteria. The device accumulates the received constraint removal request by postponing the execution of the received constraint removal request when the constraint removal request satisfies the set of accumulation criteria. In one embodiment, the device accumulates the received constraint removal request when the marker variable associated with the constraint corresponding to the constraint removal request appears in more than a pre-defined number of equations in the mathematical programming problem.

The device of one embodiment determines whether the number of the accumulated constraint removal requests has reached a capacity threshold. The device identifies constraints corresponding to the accumulated constraint removal requests for bulk removal when the number of the accumulated constraint removal requests has reached the capacity threshold. In another embodiment, the device determines whether the number of the accumulated constraint removal requests against the total number of constraints in the mathematical programming problem has reached a ratio threshold. The device reconstructs equations in the mathematical programming problem from constraints that are not being removed when the number of the accumulated constraint removal requests against the total number of constraints in the mathematical programming problem has reached the ratio threshold. In yet another embodiment, the device determines whether the accumulated constraint removal requests contain all constraints in the mathematical programming problem. The device re-initializes the mathematical programming problem as having no constraints when the accumulated constraint removal requests contain all constraints in the mathematical programming problem.

In one embodiment, the device receives a constraint addition request and determines whether a constraint corresponding to the received constraint addition request is involved in an accumulated constraint removal request. The device removes the constraint removal request from accumulation when the constraint corresponding to the received constraint addition request is involved in an accumulated constraint removal request.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
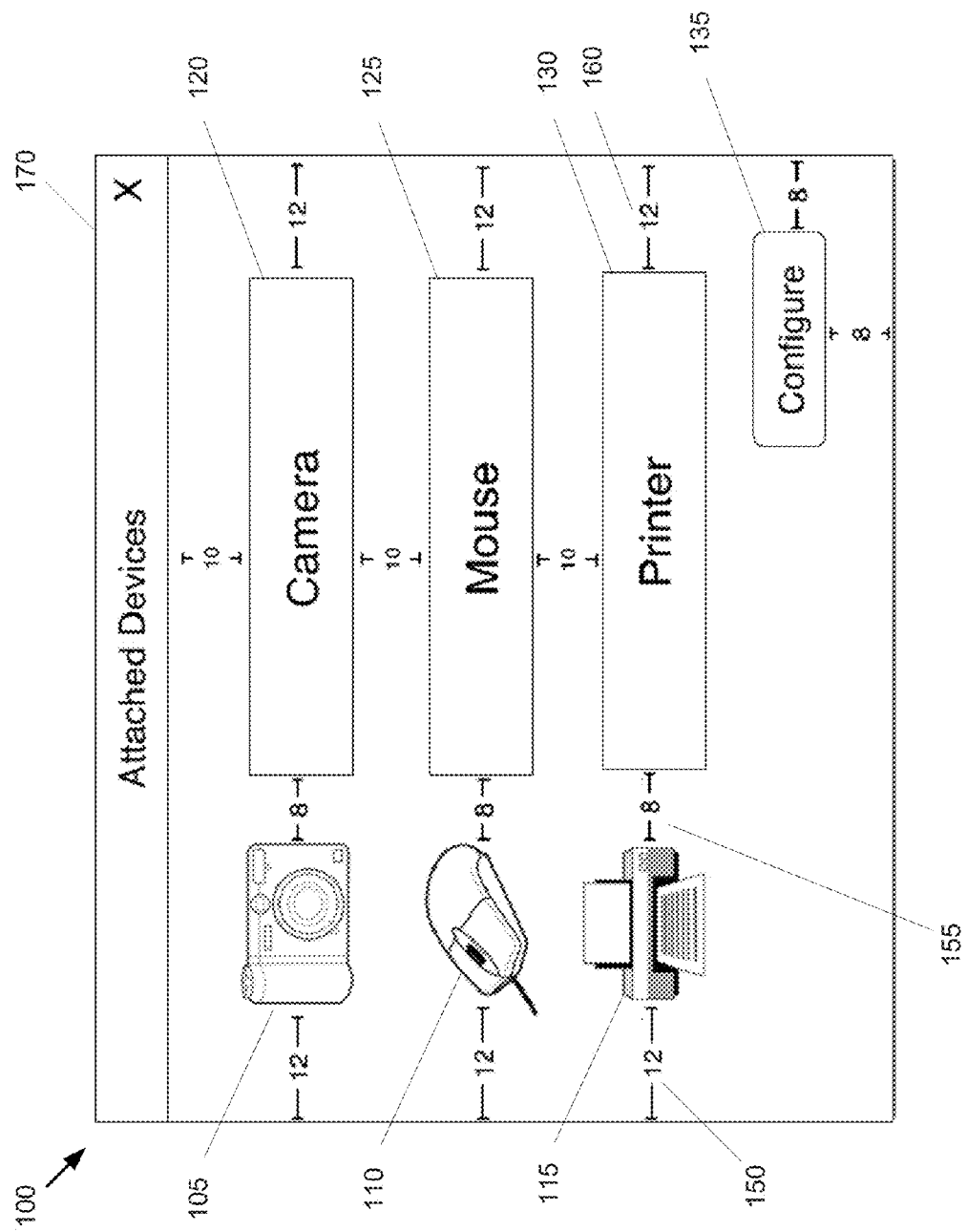
FIG. 1 is an example of using linear programming to optimize the layout of UI controls of a GUI.

A method and apparatus of a device that removes constraints in solving a mathematical programming problem is described. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose device or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A method and apparatus of a device that optimizes constraint removal in solving a mathematical programming problem in order to reduce computational cost and speed up the finding of an optimal solution is described. In one embodiment, each constraint in a mathematical programming problem is given a special variable called a marker which is only ever present in that constraint. After pivots, the marker may appear in multiple rows in the tableau representing the mathematical programming problem, which means the constraints have been "mixed in" to each other. In order to remove a constraint, it is first necessary to undo the pivoting operations, so the row once again reflects that constraint in its original form. This isolates the effects of the constraint into a single row. The row can then be removed from the tableau. Therefore, the removal of a constraint can be computationally expensive.

In one embodiment, the device identifies a plurality of constraints for bulk removal. The device further sorts the plurality of constraints based on a set of criteria to put the plurality of constraints in a sorted order. The device performs bulk constraint removal on the plurality of constraints based on the sorted order in order to improve the efficiency in solving the mathematical programming problem.

FIG. 1 is an example of using linear programming to optimize the layout of UI controls of a GUI 100. Specifically, this figure shows a set of constraints in the GUI 100 that can be used to optimize the layout of the controls. The GUI 100 is a simple user interface showing attached devices on a display device, such as a computer monitor, a cellphone display screen, and a television set. As illustrated in the figure, the GUI 100 includes a window 170, several icons 105, 110, and 115, several labels 120, 125, and 130 associated with the icons, and a button 135.

A collection of constraints position and size the UI controls (e.g., icons, labels, buttons, etc.) of the GUI 100, therefore define the layout of the UI controls on the display device on which the GUI 100 is displayed. For example, the constraints 150, 155, and 160 position the printer icon 115 and the printer label 130. The constraints are represented as equations, which are combined into a linear programming problem and then solved for an optimal solution. In the current example, the optimal solution is the optimal layout of the UI controls, given all the constraints of the constraint collection. In one embodiment, the equations for the constraints are represented in a tableau, which is a matrix representation whose rows initially correspond to the constraints. Each equation is represented by a row in the tableau. In the description that follows, the term "equation" and "row" will be used interchangeably. The equations representing the constraints 150, 155, and 160 are shown below:

$$window.left+12=printer\_icon.left \quad (1)$$

$$printer\_icon.left+printer\_icon.width+8=printer\_label.left \quad (2)$$

$$printer\_label.left+printer\_label.width+12=window.left+window.width \quad (3)$$

Equation (1), representing the constraint 150, states that the left edge of the printer icon 115 needs to maintain a distance of 12 to the left side of the window 170. Equation (2), representing the constraint 155, states that the right edge of the printer icon 115 needs to maintain a distance of 8 to the left edge of the printer label 130. Equation (3), representing the constraint 160, states that the right edge of the printer label 130 needs to maintain a distance of 12 to the right side of the window 170.

In order to solve the linear programming problem, the simplex method chooses a marker for each constraint. For example, the simplex method chooses marker1-3 for the constraints 150, 155, and 160, respectively. The simplex method then adds each marker to its corresponding equation.

After choosing a variable in each equation and solving for it, Equations (1)-(3), with markers, become:

$$window.left=-12+printer\_icon.left+marker1 \quad (4)$$

$$printer\_icon.left=-8-printer\_icon.width+printer\_label.left+marker2 \quad (5)$$

$$printer\_label.left=-12-printer\_label.width+window.left+window.width+marker3 \quad (6)$$

The variables that were chosen and solved, thus showed on the left hand side of the equal signs are called the basic variables, while the variables on the right hand side of the equal signs are called the parametric variables. For example, in Equations (4)-(6), window.left, printer_icon.left, and printer_label.left are basic variables, while printer_icon.width, printer_label.width, and window.width are parametric variables.

Each basic variable is substituted out wherever it appears in the right hand side. After substitutions, Equations (4)-(6) become:

$$window.left=-12+(-8-printer\_icon.width+printer\_label.left+marker2)+marker1 \quad (7)$$

$$printer\_icon.left=-8-printer\_icon.width+printer\_label.left+marker2 \quad (8)$$

$$printer\_label.left=-12-printer\_label.width+(-12+(-8-printer\_icon.width+printer\_label.left+marker2)+marker1)+window.width+marker3 \quad (9)$$

After simplification, Equations (7)-(9) become:

$$window.left=-20-printer\_icon.width+printer\_label.left+marker2+marker1 \quad (10)$$

$$printer\_icon.left=-8-printer\_icon.width+printer\_label.left+marker2 \quad (11)$$

$$window.width=32+printer\_label.width+printer\_icon.width-marker1-marker2-marker3 \quad (12)$$

Because the basic variable printer_label.left is cancelled out from both sides of Equation (9), a new variable, window.width, is chosen to become a basic variable in Equation (12) after simplification.

Figure 2:
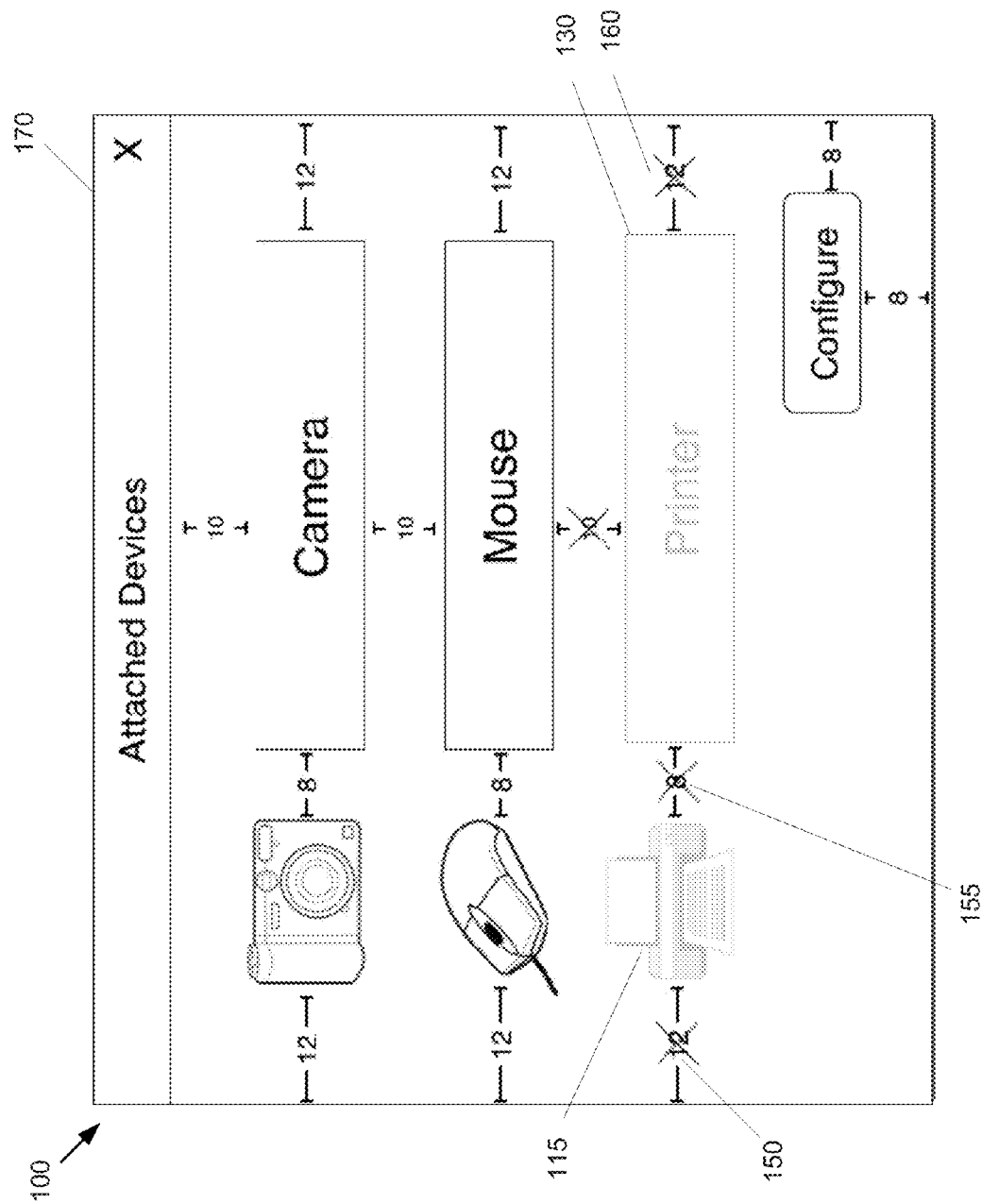
FIG. 2 illustrates an updated GUI after the user has detached a printer.

FIG. 2 illustrates an updated GUI 100 after the user has detached the printer. Specifically, this figure shows the removal of several constraints from the constraint collection in accordance with the updated GUI 100. As a consequence of the detachment of the printer, the printer icon 115 and the printer label 130 have been removed from the window 170, as indicated by the graying out of the printer icon 115 and the printer label 130 in FIG. 2. Because the constraints 150, 155, and 160 are no longer relevant to the control layout of the updated GUI 100, the constraints 150, 155, and 160 need to be removed from the constraint collection, thus removed from the linear programming problem, as indicated by the cross-out signs over the constraints 150, 155, and 160 in FIG. 2. Once the constraints 150, 155, and 160 are removed, the linear programming problem becomes a new problem that optimizes the layout for the remaining UI controls of the updated GUI 100 using the updated set of constraints. The updated GUI 100 is then displayed on the display device with the layout of UI controls optimized by the new linear programming problem according to the updated constraint collection.

Figure 3:
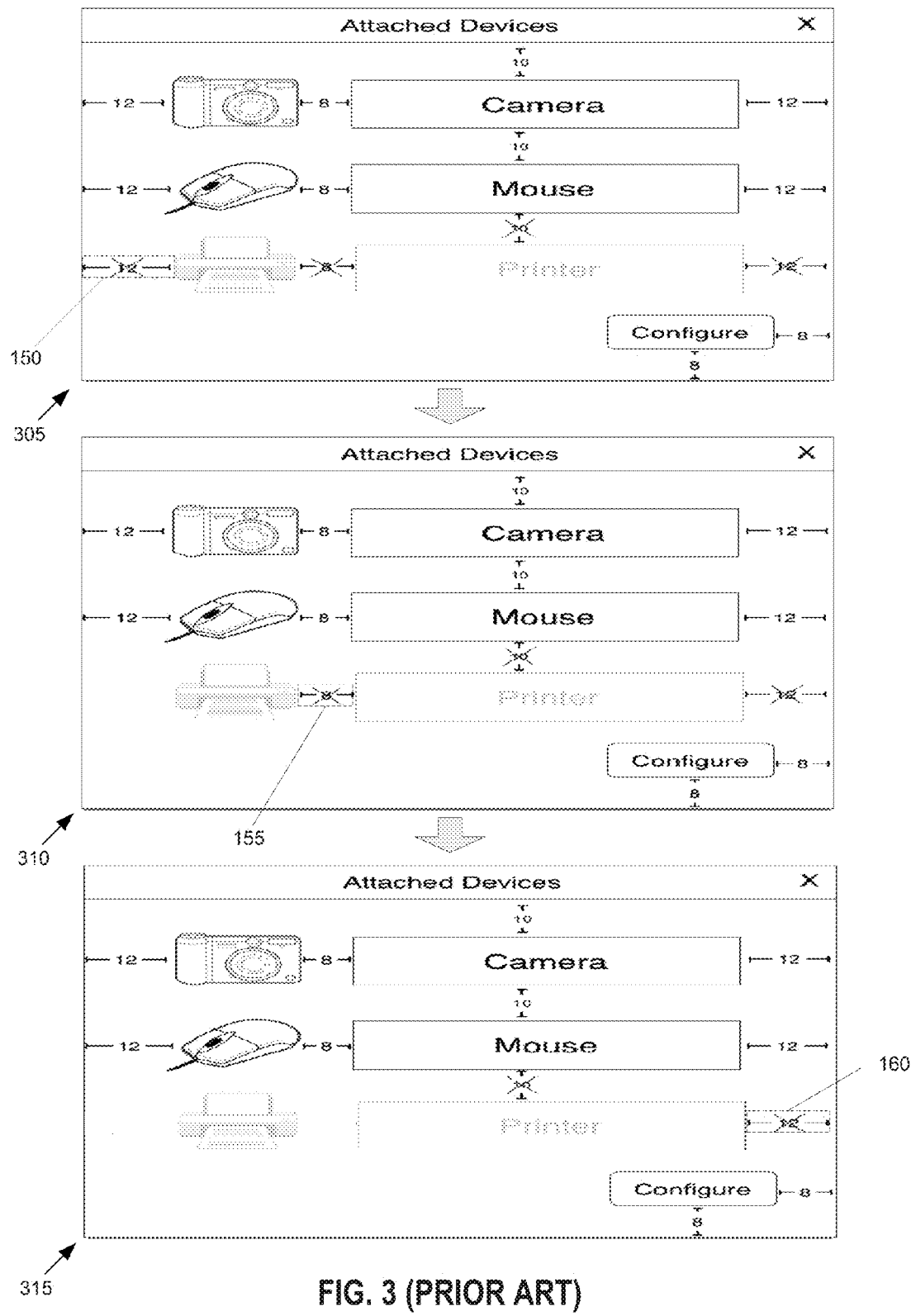
FIG. 3 illustrates an example of a prior art approach for removing constraints within the simplex method.

The order in which constraints are removed in solving a mathematical programming problem does not affect the final result. So the simplex algorithm is free to remove the constraints in any order. FIG. 3 illustrates an example of a prior art approach for removing constraints within the simplex method. Specifically, this figure shows performing constraint removals in an arbitrary sequence without optimization. This figure illustrates the example in three stages 305, 310, and 315. The first stage 305 illustrates choosing constraint 150 to be removed first. Constraint 150 is marked by marker1. In order to remove constraint 150, the simplex method needs to choose an equation that contains marker1 from Equations (10)-(12), solve for marker1, and then substitute marker1 in other equations. For example, the simplex method chooses Equation (10) to solve for marker1. After solving for marker1 of constraint 150, Equations (10)-(12) become:

$$\text{marker1}=20+\text{window.left}+\text{printer\_icon.width}-\text{printer\_label.left}-\text{marker2} \quad (13)$$

$$\text{printer\_icon.left}=-8-\text{printer\_icon.width}+\text{printer\_label.left}+\text{marker2} \quad (14)$$

$$\text{window.width}=32+\text{printer\_label.width}+\text{printer\_icon.width}-\text{marker1}-\text{marker2}-\text{marker3} \quad (15)$$

After substituting for marker1 in other equations based on Equation (13), Equations (13)-(15) become:

$$\text{marker1}=20+\text{window.left}+\text{printer\_icon.width}-\text{printer\_label.left}-\text{marker2} \quad (16)$$

$$\text{printer\_icon.left}=-8-\text{printer\_icon.width}+\text{printer\_label.left}+\text{marker2} \quad (17)$$

$$\text{window.width}=32+\text{printer\_label.width}+\text{printer\_icon.width}-(20+\text{window.left}+\text{printer\_icon.width}-\text{printer\_label.left}-\text{marker2})-\text{marker2}-\text{marker3} \quad (18)$$

Because marker1 appears in two equations, the simplex method requires one substitution to isolate marker1 to a single equation, i.e., Equation (16), at which point Equation (16) may be dropped from the linear programming problem. Constraint 150 is successfully removed as a result. In one embodiment, that means the row representing Equation (16) in the tableau of the linear programming problem is removed. After removal of Equation (16) and simplification, Equations (16)-(18) become:

$$\text{printer\_icon.left}=-8-\text{printer\_icon.width}+\text{printer\_label.left}+\text{marker2} \quad (19)$$

$$\text{window.width}=12+\text{printer\_label.width}+\text{printer\_label.left}-\text{window.left}-\text{marker3} \quad (20)$$

The second stage 310 illustrates choosing constraint 155 to remove after constraint 150 has been removed. Constraint 155 is marked by marker2. In order to remove constraint 155, the simplex method needs to choose an equation that contains marker2, solve for marker2, and then substitute marker2 in other equations. However, because marker2 only appears in Equation (19) in this example, no substitution is required to isolate marker2. The simplex method simply drops Equation (19) from the linear programming problem. Constraint 155 is successfully removed as a result. In one embodiment, that means the row representing Equation (19) in the tableau of the linear programming problem is removed. After removal of Equation (19), Equations (19) and (20) become:

$$\text{window.width}=12+\text{printer\_label.width}+\text{printer\_label.left}-\text{window.left}-\text{marker3} \quad (21)$$

The third stage 315 illustrates choosing constraint 160 to remove after both constraints 150 and 155 have been removed. Constraint 160 is marked by marker3. In order to remove constraint 155, the simplex method needs to choose an equation that contains marker3, solve for marker3, and then substitute marker3 in other equations. However, because marker3 only appears in Equation (21) in this example, no substitution is required to isolate marker3. The simplex method simply drops Equation (21) from the linear programming problem. Constraint 160 is successfully removed as a result. In one embodiment, that means the row representing Equation (21) in the tableau of the linear programming problem is removed.

Figure 4:
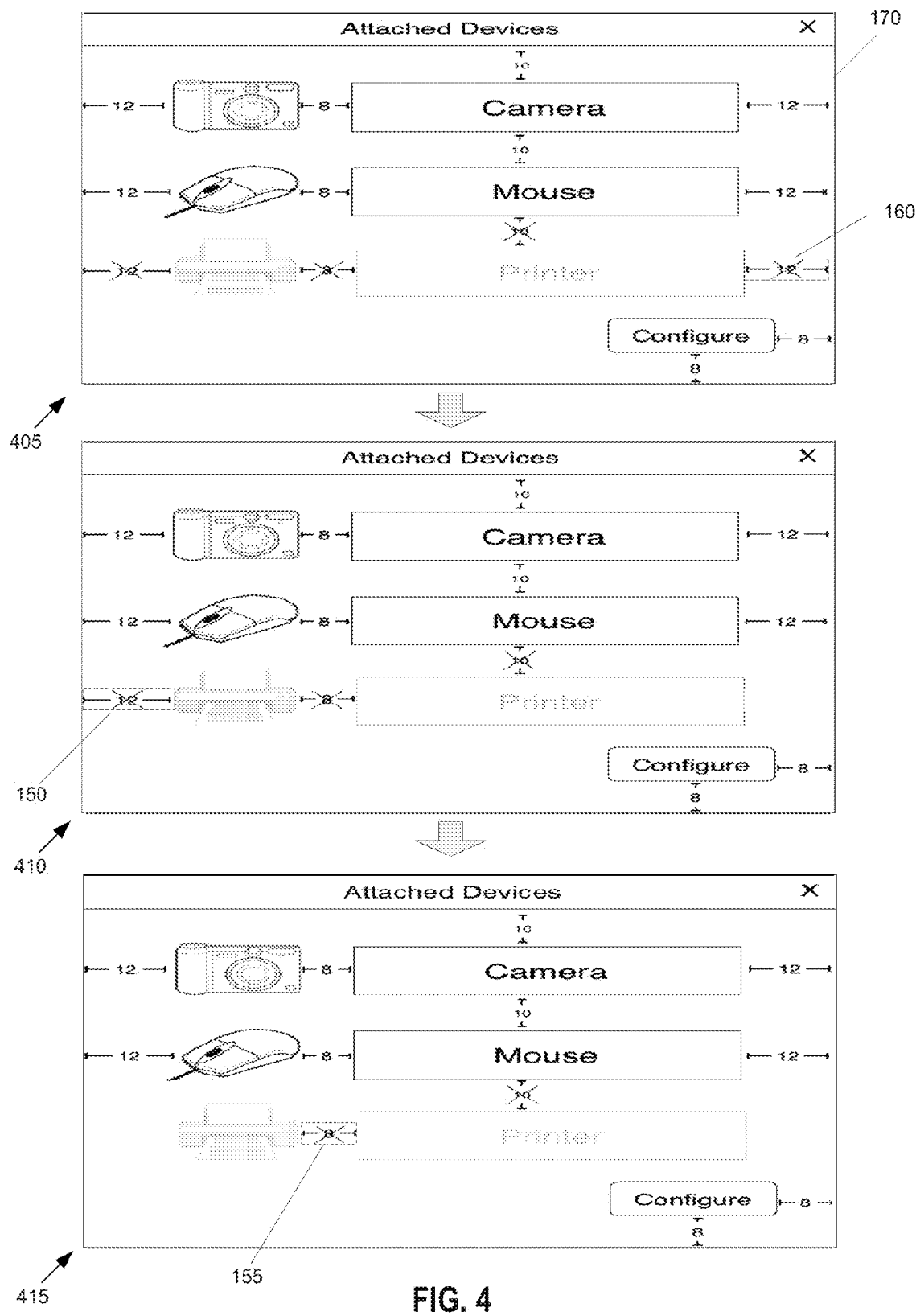
FIG. 4 illustrates an example of removing constraints within the simplex method using the present invention.

Because pivoting is a computationally expensive task, minimizing the amount of pivoting can improve the efficiency and speed of solving a mathematical programming problem. Removing a constraint requires substituting out the marker for the constraint in every equation in which the marker appears, so it is more optimal to remove constraints whose markers appear in the fewest rows first. FIG. 4 illustrates an example of removing constraints within the simplex method using the present invention. Specifically, this figure shows an example of performing constraint removals in an optimal order in three stages 405, 410, and 415.

The first stage 405 illustrates choosing constraint 160 to remove first. Constraint 160 is marked by marker3. In order to remove constraint 160, the simplex method needs to choose an equation that contains marker3 from Equations (10)-(12), solve for marker3, and then substitute marker3 in other equations. However, because marker3 appears only in Equation (12) in this example, no substitution is required to isolate marker3. The simplex method simply drops Equation (12) from the linear programming problem. Constraint 160 is successfully removed as a result. In one embodiment, that means the row representing Equation (12) in the tableau of the linear programming problem is removed. After removal of Equation (12), Equations (10)-(12) become:

$$\text{window.left}=-20-\text{printer\_icon.width}+\text{printer\_label.left}+\text{marker2}+\text{marker1} \quad (22)$$

$$\text{printer\_icon.left}=-8-\text{printer\_icon.width}+\text{printer\_label.left}+\text{marker2} \quad (23)$$

The second stage 410 illustrates choosing constraint 150 to remove after constraint 160 has been removed. Constraint 150 is marked by marker1. In order to remove constraint 150, the simplex method needs to choose an equation that contains marker1, solve for marker1, and then substitute marker1 in other equations. However, because marker1 appears in only Equation (22) in this example, the simplex method simply drops Equation (22) from the linear programming problem. Constraint 150 is successfully removed as a result. In one embodiment, that means the row representing Equation (22) in the tableau of the linear programming problem is removed. After removal of Equation (22), Equations (22) and (23) become:

$$\text{printer\_icon.left}=-8-\text{printer\_icon.width}+\text{printer\_label.left}+\text{marker2} \quad (24)$$

The third stage 415 illustrates choosing constraint 155 to remove after both constraints 150 and 160 have been removed. Constraint 155 is marked by marker2. In order to remove constraint 155, the simplex method needs to choose an equation that contains marker2, solve for marker2, and then substitute marker2 in other equations. However, because marker2 appears in only Equation (24) in this example, the simplex method simply drops Equation (24) from the linear programming problem. Constraint 155 is successfully removed as a result. In one embodiment, that means the row representing Equation (24) in the tableau of the linear programming problem is removed.

In this example, because of the application of an optimal order in removing constraints, the simplex method avoids substitutions entirely. As a result, the efficiency and speed of the simplex method is improved. Therefore, the layout optimization for the remaining UI controls in window 170 is faster after the printer is detached. Consequently, the user will experience a higher level of responsiveness in interacting with window 170.

Figure 5:
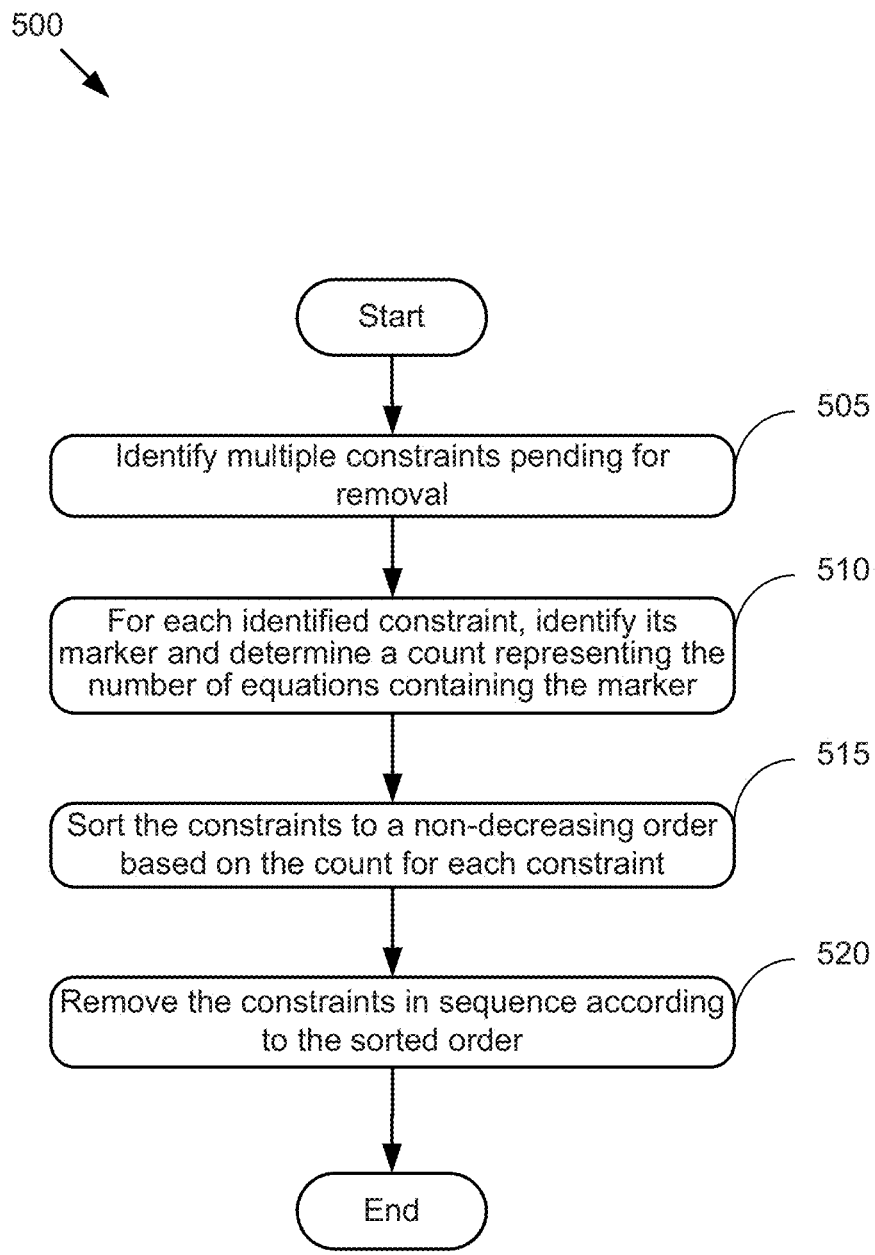
FIG. 5 illustrates a flowchart of one embodiment of a process to remove constraints in an optimal order.

FIG. 5 illustrates a flowchart of one embodiment of a process 500 to remove constraints in an optimal order. In one embodiment, a device executes process 500 to perform bulk constraint removal through an optimal order when several constraints of a mathematical programming problem are being removed due to modifications made to the problem. In FIG. 5, process 500 begins by identifying (at block 505) multiple constraints pending removal. For example and in one embodiment, process 500 identifies constraints 150, 155, and 160 for removal in the example described in FIG. 4 above. The operation at block 505 will be described in detail below in FIGS. 7-10.

At block 510, process 500 identifies the marker associated with each identified constraint and determines a count for each constraint by counting the number of equations containing the marker in the mathematical programming problem. In one embodiment, instead of counting the number of equations containing the marker, the process determines the count for each constraint by counting the number of rows containing the marker in the tableau for the mathematical programming problem. For example and in one embodiment, process 500 identifies marker1-3 associated with constraints 150, 155, and 160 in the example described in FIG. 4 above. Process 500 then determines that marker1 appears in Equations (10) and (12), marker2 appears in Equations (10)-(12), and marker3 appears in Equation (12). Therefore, two equations contain marker1, three equations contain marker2, and only one equation contains marker3.

At block 515, process 500 sorts the identified constraints to a non-decreasing order based on the determined count for each constraint. For example and in one embodiment, process 500 sorts constraints 150, 155, and 160 based on the number of equations containing their corresponding markers marker1-3 in the example described in FIG. 4 above. Because two equations contain marker1, three equations contain marker2, and only one equation contains marker3, constraints 150, 155, and 160 are arranged in the sorted order of 160, 150, and 155. In one embodiment, instead of fully sort the identified constraints at block 515, process 500 "somewhat sorts" the identified constraints, so that they are in a more (but not necessarily maximally) optimal order. For example and in one embodiment, process 500 performs quicksort on the identified constraints, but stops the quicksort at a recursion depth of three, thus generating a partially sorted order. This reduces the computational expense of performing sorting.

Next, process 500 removes (at block 520) the constraints in sequence according to the sorted order. For example and in one embodiment, process 500 removes constraint 160 first, constraint 150 next, and constraint 155 last in the example described in FIG. 4 above. Process 500 then ends.

One of ordinary skill in the art will recognize that instead of sorting the constraints according to the number of equations containing the marker for each constraint, the process 500 can sort the constraints according to a different metric. For example and in one embodiment, the process 500 sort the constraints according to the time at which each constraint is added into the mathematical programming problem, so that the most recently added constraint will be removed first.

One of ordinary skill in the art will recognize that process 500 is a conceptual representation of the operations used to perform bulk constraint removal. The specific operations of process 500 may not be performed in the exact order shown and described. The specific operations may not be performed in one continuous series of operations, and different specific operations may be performed in different embodiments. For example and in one embodiment, instead of merely counting rows, process 500 separates the identified constraints into disjoint sets, where the marker of a constraint in one disjoint set does not appear in the same equation with the marker of a constraint that belongs to any other disjoint set. Process 500 then removes those disjoint sets in parallel, e.g., in a multithreaded manner. For example, if two markers do not both appear in the same equation, process 500 can divide the two constraints associated with the two markers into two disjoint sets and remove these two constraints in parallel. The parallel removal of the two constraints is feasible because removing them will not modify any equation in common.

Furthermore, process 500 could be implemented using several sub-processes, or as part of a larger macro process. For instance, in some embodiments, the process 500 is performed by one or more software applications that execute on one or more computers. One of ordinary skill in the art will also recognize that process 500 can be applied to any method or apparatus of a device for solving a constraint based mathematical programming problem, including but not limited to the simplex method and the incremental simplex method.

Figure 6:
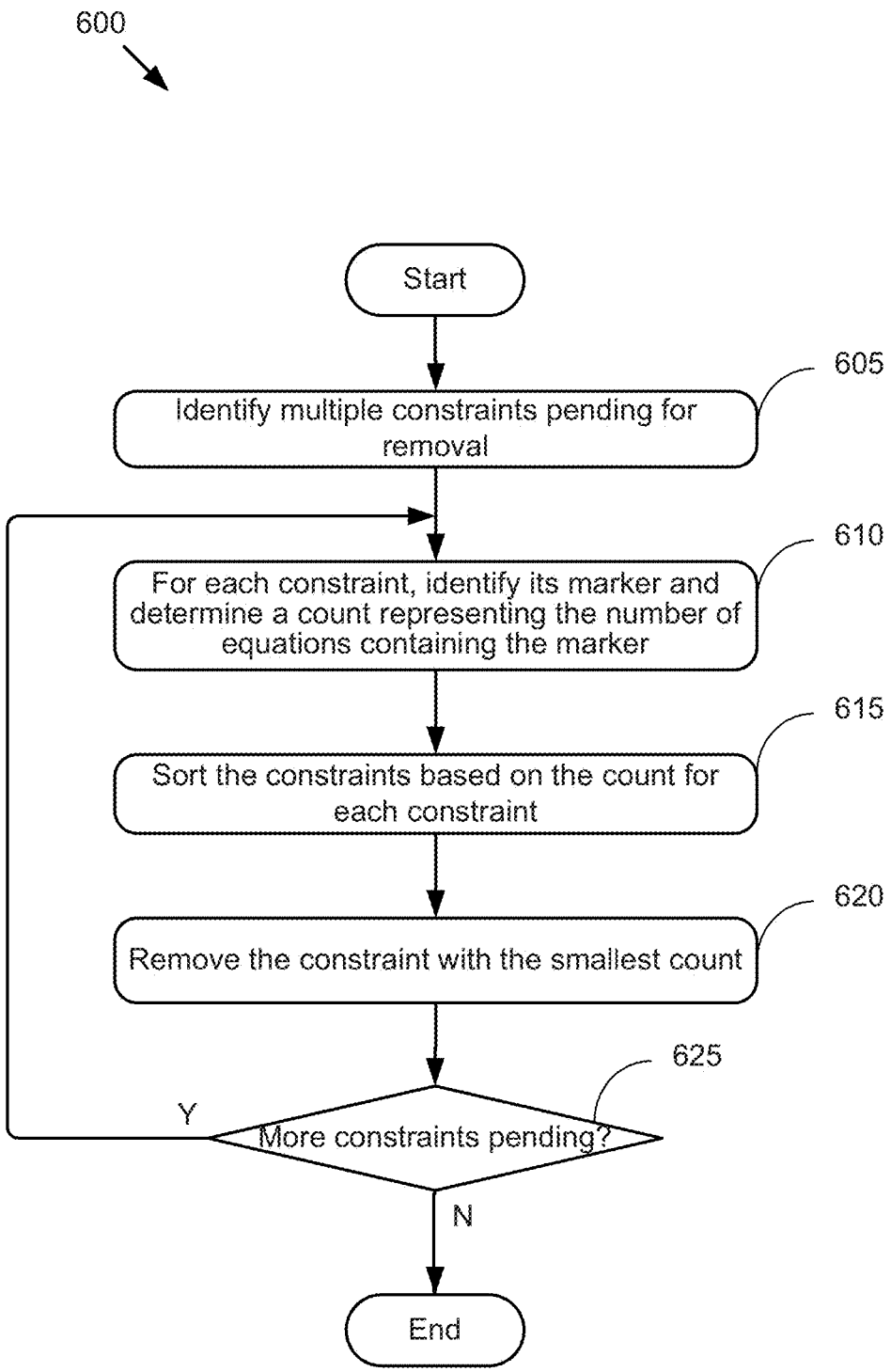
FIG. 6 illustrates a flowchart of one embodiment of a process to remove constraints in a continually optimal order.

As each equation is removed, substitutions are performed on the remaining equations. This may change the optimal order for the remaining constraints that are still pending removal. In one embodiment, the method and apparatus of the present invention re-sorts the remaining constraints that are pending removal after each constraint is removed. So that the order for removing constraints stays continually optimal. FIG. 6 illustrates a flowchart of one embodiment of a process 600 to remove constraints in such a continually optimal order. In one embodiment, a device executes process 600 to perform bulk constraint removal through a continually optimal order when several constraints of a mathematical programming problem are pending removal due to modifications made to the problem. In FIG. 6, process 600 begins by identifying (at block 605) multiple constraints pending for removal.

At block 610, process 600 identifies the marker associated with each identified constraint and determines a count for each constraint by counting the number of equations containing the marker in the mathematical programming problem. In one embodiment, instead of counting the number of equations containing the marker, the process determines the count for each constraint by counting the number of rows containing the marker in the tableau for the mathematical programming problem.

At block 615, process 600 sorts the identified constraints to a non-decreasing order based on the determined count for each constraint. In one embodiment, instead of fully sorting the identified constraints at block 615, process 600 "somewhat sorts" the identified constraints, so that they are in a more (but not necessarily maximally) optimal order. For example and in one embodiment, process 600 performs quicksort on the identified constraints, but stops the quicksort at a recursion depth of three, thus generates a partially sorted order. This reduces the computational expense of performing sorting.

Next, process 600 removes (at block 620) the constraints with the smallest count. For example and in one embodiment, process 600 removes constraint 160 in the example described in FIG. 4 above because the marker associated with constraint 160 only appears in one equation thus the count for constraint 160 is the smallest.

At block 625, process 600 determines whether there are more constraints pending removal. If there are more constraints pending removal, process 600 loops back to block 610 to re-determine the count for each remaining constraint and re-sort the remaining constraints that are pending removal. If there is no more constraint pending removal, process 600 ends. In one embodiment, in each re-sort, process 600 chooses an algorithm that is optimized for sorting a pre-existing order. For example and in one embodiment, process 600 uses quicksort to perform the initial sorting, and uses merge sort to perform each subsequent re-sort.

One of ordinary skill in the art will recognize that instead of sorting the constraints according to the number of equations containing the marker for each constraint, the process 600 can sort the constraints according to a different metric. For example and in one embodiment, the process 600 sorts the constraints according to the time at which each constraint is added into the mathematical programming problem. So that the most recently added constraint will be removed first. One of ordinary skill in the art will also recognize that instead of re-sorting the remaining constraints every time a constraint is removed, the process 600 of one embodiment re-sorts the remaining constraints pending removal every time after a fixed number of (e.g., three) constraints are removed. So that the order for constraint removal remains mostly optimal while reducing computing overhead compared to re-sorting the remaining constraints every time a constraint is removed.

One of ordinary skill in the art will recognize that process 600 is a conceptual representation of the operations used to perform bulk constraint removal. The specific operations of process 600 may not be performed in the exact order shown and described. The specific operations may not be performed in one continuous series of operations, and different specific operations may be performed in different embodiments. Furthermore, process 600 could be implemented using several sub-processes, or as part of a larger macro process. For instance, in some embodiments, the process 600 is performed by one or more software applications that execute on one or more computers. The person of ordinary skill in the art will also recognize that process 600 can be applied to any method or apparatus of a device for solving a constraint based mathematical programming problem, including but not limited to the simplex method and the incremental simplex method.

Figure 7:
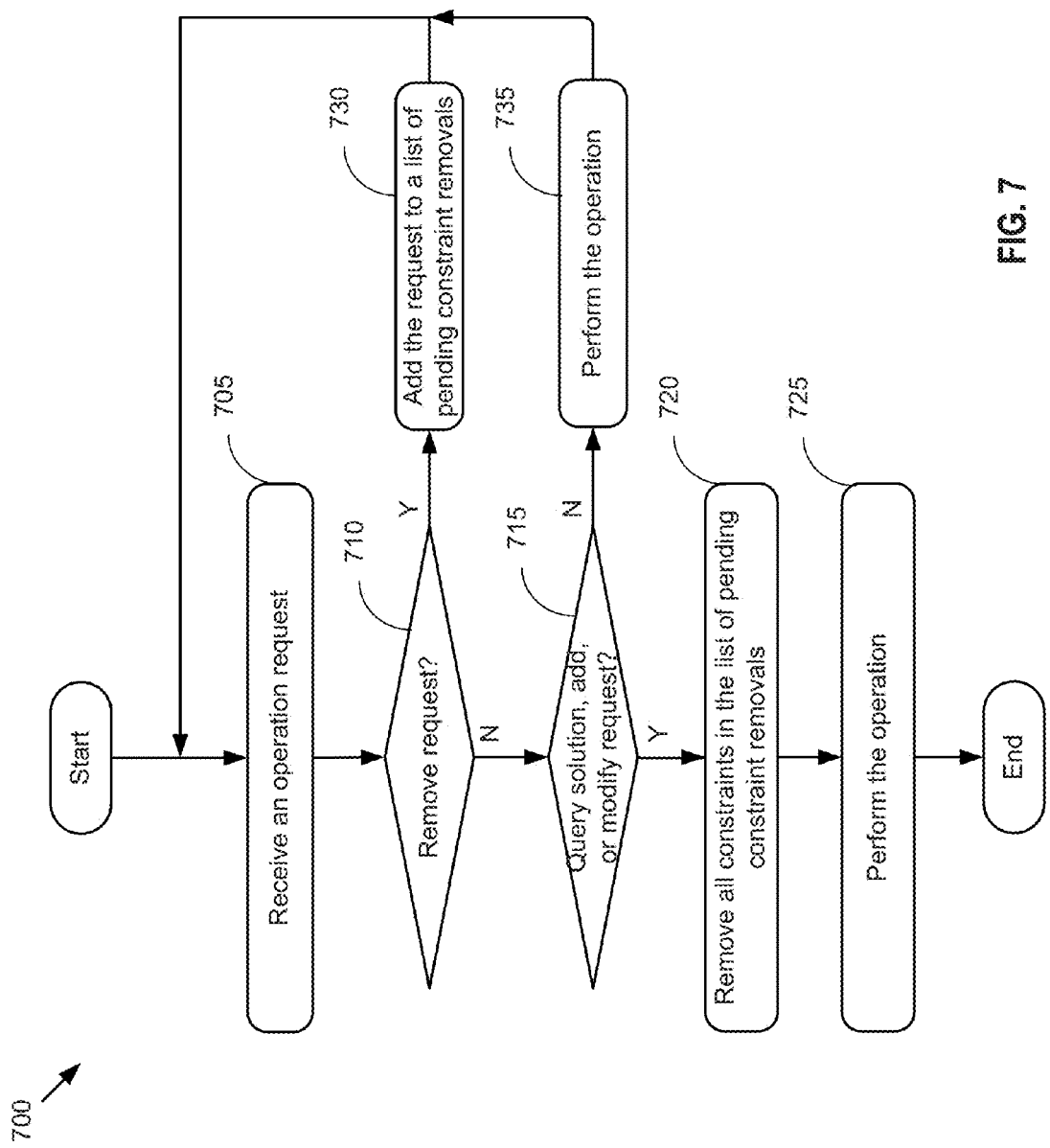
FIG. 7 illustrates a flowchart of one embodiment of a process to accumulate constraints for bulk removal.

In order to perform the bulk constraint removal described above in FIGS. 5 and 6, the method and apparatus of the present invention needs to accumulate multiple constraints for removal. FIG. 7 illustrates a flowchart of one embodiment of a process 700 to accumulate constraints for bulk removal. In one embodiment, a device executes process 700 before performing the operations described above in FIGS. 5 and 6. In FIG. 7, process 700 begins by receiving (at block 705) an operation request.

At block 710, process 700 determines whether the received operation request is a constraint removal request. If the received operation request is a constraint removal request, process 700 adds (at block 730) the constraint removal request to a list of pending constraint removal requests. By accumulating these constraint removal requests, the device can later perform these requested constraint removal operations in an order that is more optimal than the order implied by the sequence of receiving these requests, by using the bulk constraint removal operations described above in FIGS. 5 and 6. Process 700 then loops back to block 705 to receive a new operation request.

If the received operation request is not a constraint removal request, process 700 determines (at block 715) whether the received operation request is a query solution request, constraint addition request, or constraint modification request. If the received operation request is not a query solution request, constraint addition request, or constraint modification request, process 700 performs (at block 735) the requested operation. Process 700 then loops back to block 705 to receive a new operation request.

If the received operation request is a query solution request, constraint addition request, or constraint modification request, process 700 removes (at block 720) all constraints in the list of pending constraint removals. In one embodiment, the operation of block 720 includes the operations described in FIGS. 5 and 6 above.

At block 725, process 700 performs the requested operation, which is a query solution request, a constraint addition request, or a constraint modification request. Process 700 then ends.

One of ordinary skill in the art will recognize that process 700 is a conceptual representation of the operations used to perform bulk constraint removal. The specific operations of process 700 may not be performed in the exact order shown and described. The specific operations may not be performed in one continuous series of operations, and different specific operations may be performed in different embodiments. For example and in one embodiment, if the received operation request is a constraint addition request and the constraint being added by the request is also pending removal in the list of pending constraint removals, process 700 simply removes the pending constraint removal for that constraint from the list of pending constraint removals. Furthermore, process 700 could be implemented using several sub-processes, or as part of a larger macro process. For instance, in some embodiments, the process 700 is performed by one or more software applications that execute on one or more computers. One of ordinary skill in the art will also recognize that process 700 can be applied to any method or apparatus of a device for solving a constraint based mathematical programming problem, including but not limited to the simplex method and the incremental simplex method.

Figure 8:
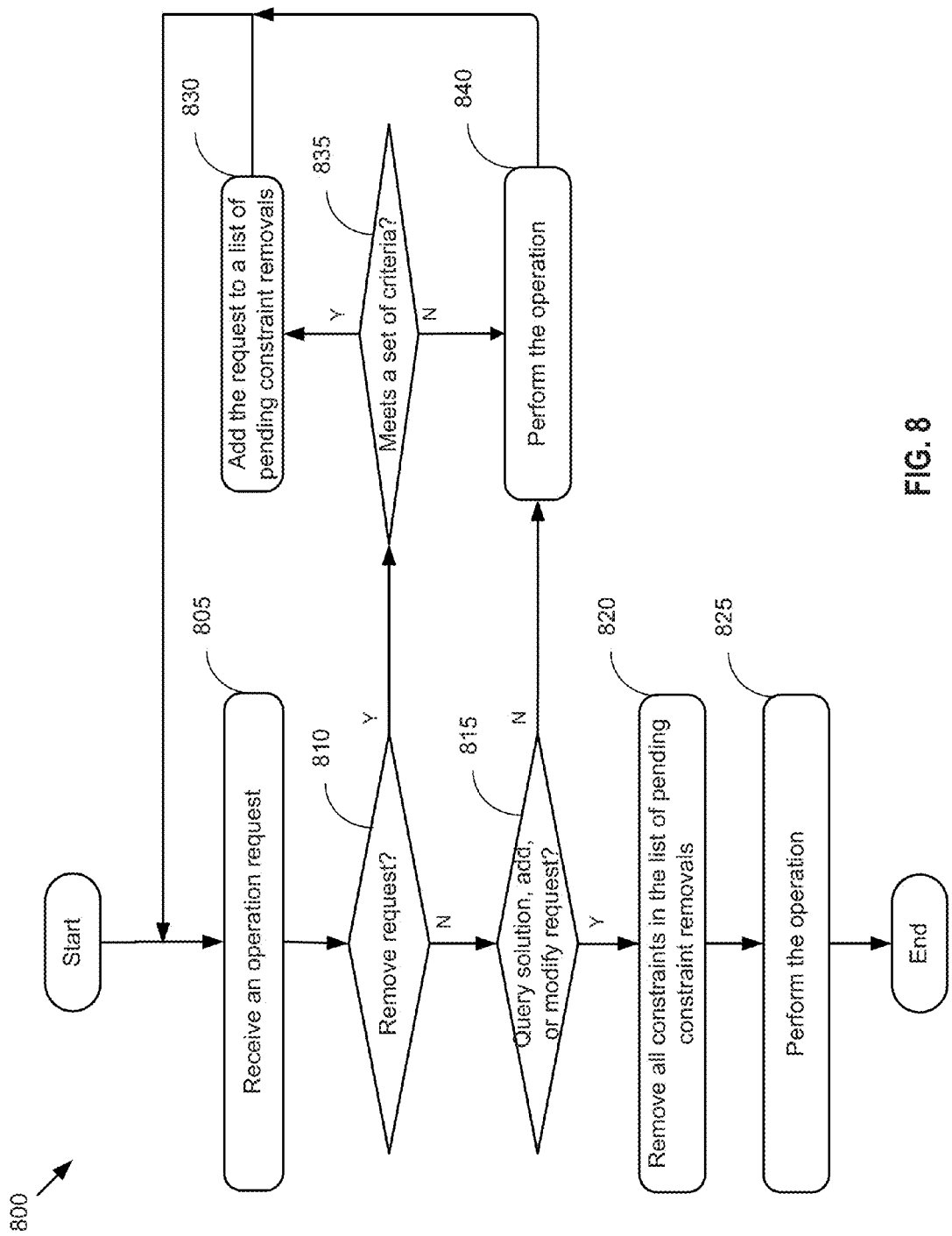
FIG. 8 illustrates a flowchart of one embodiment of a process to accumulate constraints with a set of criteria.

FIG. 8 illustrates a flowchart of one embodiment of a process 800 to accumulate constraints with a set of criteria. In one embodiment, a device executes process 800 before performing the operations described above in FIGS. 5 and 6. In FIG. 8, process 800 begins by receiving (at block 805) an operation request.

At block 810, process 800 determines whether the received operation request is a constraint removal request. If the received operation request is a constraint removal request, process 800 determines (at block 835) whether the constraint requested for removal satisfies a set of criteria. In one embodiment, the set of criteria includes a requirement that the marker for the constraint appears in at least a pre-determined number of equations of the mathematical programming problem. For example and in one embodiment, the set of criteria includes a requirement that the marker for the constraint appears in at least two equations of the mathematical programming problem. In another embodiment, the set of criteria includes a requirement that the marker for the constraint appears in at least five equations of the mathematical programming problem.

If the constraint requested for removal satisfies the set of criteria, process 800 adds (at block 830) the constraint removal request to a list of pending constraint removal requests. By accumulating these constraint removal requests, the device can later perform these requested constraint removal operations in an order that is more optimal than the order implied by the sequence of receiving these requests, by using the bulk constraint removal operations described above in FIGS. 5 and 6. Process 800 then loops back to block 805 to receive a new operation request.

If the constraint requested for removal does not satisfy the set of criteria, process 800 performs (at block 840) constraint removal operation to remove the constraint from the mathematical programming problem. Process 800 then loops back to block 805 to receive a new operation request.

If the received operation request is not a constraint removal request, process 800 determines (at block 815) whether the received operation request is a query solution request, constraint addition request, or constraint modification request. If the received operation request is not a query solution request, constraint addition request, or constraint modification request, process 800 performs (at block 840) the requested operation. Process 800 then loops back to block 805 to receive a new operation request.

If the received operation request is a query solution request, constraint addition request, or constraint modification request, process 800 removes (at block 820) all constraints in the list of pending constraint removals. In one embodiment, the operation of block 820 is the operations described above in FIGS. 5 and 6.

At block 825, process 800 performs the requested operation, which is a query solution request, a constraint addition request, or a constraint modification request. Process 800 then ends.

One of ordinary skill in the art will recognize that process 800 is a conceptual representation of the operations used to perform bulk constraint removal. The specific operations of process 800 may not be performed in the exact order shown and described. The specific operations may not be performed in one continuous series of operations, and different specific operations may be performed in different embodiments. For example and in one embodiment, if the received operation request is a constraint addition request and the constraint being added by the request is also pending removal in the list of pending constraint removals, process 800 simply remove the pending constraint removal for that constraint from the list of pending constraint removals. Furthermore, process 800 could be implemented using several sub-processes, or as part of a larger macro process. For instance, in some embodiments, the process 800 is performed by one or more software applications that execute on one or more computers. One of ordinary skill in the art will also recognize that process 800 can be applied to any method or apparatus of a device for solving a constraint based mathematical programming problem, including but not limited to the simplex method and the incremental simplex method.

Figure 9:
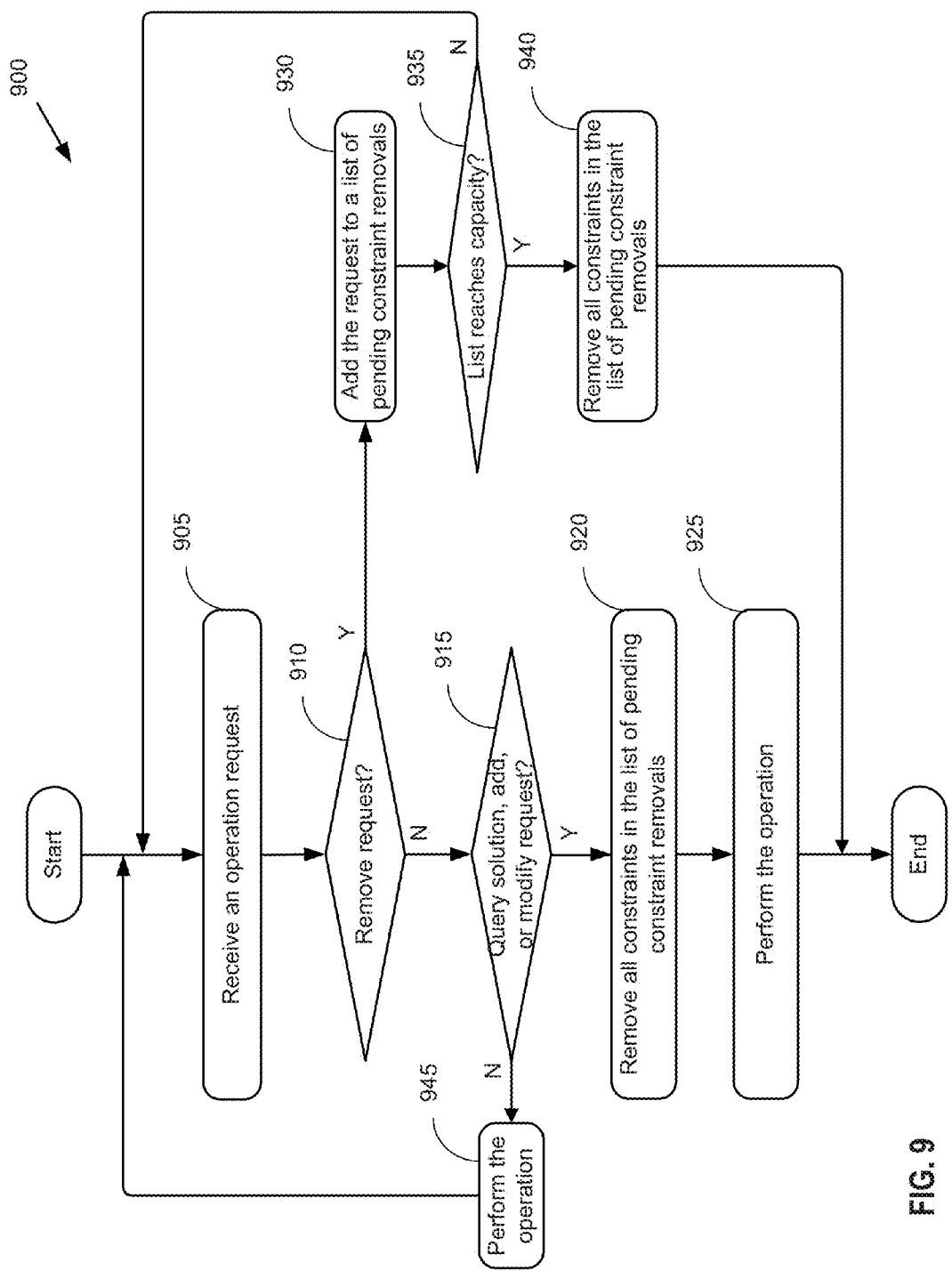
FIG. 9 illustrates a flowchart of one embodiment of a process to accumulate constraints with a limitation on the number of constraints that can be accumulated.

FIG. 9 illustrates a flowchart of one embodiment of a process 900 to accumulate constraints with a limitation on the number of constraints that can be accumulated. In one embodiment, a device executes process 900 before performing the operations described above in FIGS. 5 and 6. In FIG. 9, process 900 begins by receiving (at block 905) an operation request.

At block 910, process 900 determines whether the received operation request is a constraint removal request. If the received operation request is a constraint removal request, process 900 adds (at block 930) the constraint removal request to a list of pending constraint removal requests. By accumulating these constraint removal requests, the device can later perform these requested constraint removal operations in an order that is more optimal than the order implied by the sequence of receiving these requests, by using the bulk constraint removal operations described above in FIGS. 5 and 6.

Process 900 determines (at block 935) whether the list of pending constraint removals has reached its maximum capacity, i.e., the maximum number of constraints that can be accumulated. If the list has not reached its capacity, Process 900 loops back to block 905 to receive a new operation request. If the list has reached its capacity, Process 900 removes (at block 940) all constraints in the list of pending constraint removals. In one embodiment, the operation of block 940 includes the operations described above in FIGS. 5 and 6. Process 900 then ends.

If the received operation request is not a constraint removal request, process 900 determines (at block 915) whether the received operation request is a query solution request, constraint addition request, or constraint modification request. If the received operation request is not a query solution request, constraint addition request, or constraint modification request, process 900 performs (at block 945) the requested operation. Process 900 then loops back to block 905 to receive a new operation request.

If the received operation request is a query solution request, constraint addition request, or constraint modification request, process 900 removes (at block 920) all constraints in the list of pending constraint removals. In one embodiment, the operation of block 920 includes the operations described above in FIGS. 5 and 6.

At block 925, process 900 performs the requested operation, which is a query solution request, a constraint addition request, or a constraint modification request. Process 900 then ends.

One of ordinary skill in the art will recognize that process 900 is a conceptual representation of the operations used to perform bulk constraint removal. The specific operations of process 900 may not be performed in the exact order shown and described. The specific operations may not be performed in one continuous series of operations, and different specific operations may be performed in different embodiments. For example and in one embodiment, if the received operation request is a constraint addition request and the constraint being added by the request is also pending removal in the list of pending constraint removals, process 900 simply removes the pending constraint removal for that constraint from the list of pending constraint removals. Furthermore, process 900 could be implemented using several sub-processes, or as part of a larger macro process. For instance, in some embodiments, the process 900 is performed by one or more software applications that execute on one or more computers. One of ordinary skill in the art will also recognize that process 900 can be applied to any method or apparatus of a device for solving a constraint based mathematical programming problem, including but not limited to the simplex method and the incremental simplex method.

Figure 10:
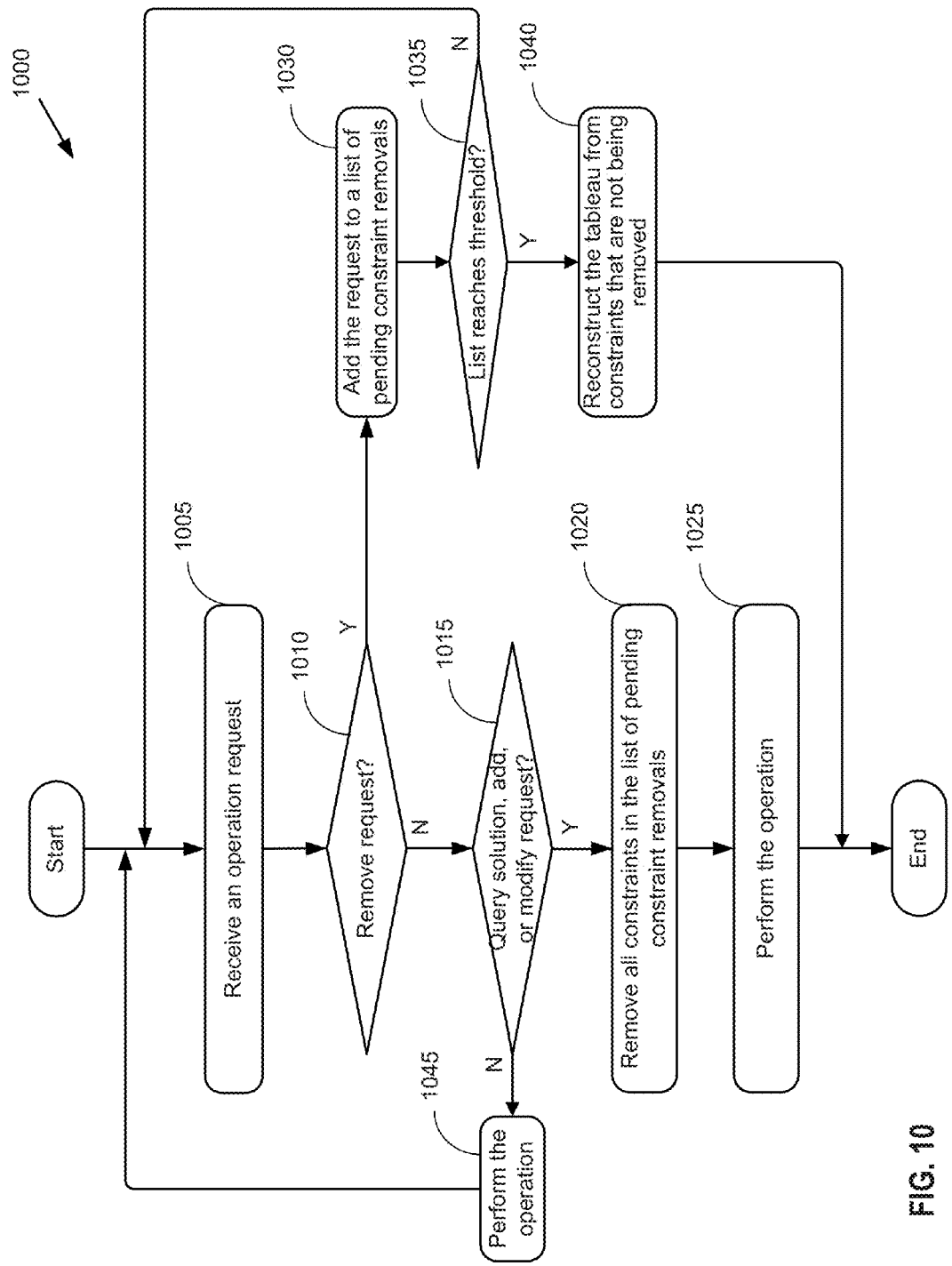
FIG. 10 illustrates a flowchart of one embodiment of a process to accumulate constraints with an option to reconstruct the tableau.

FIG. 10 illustrates a flowchart of one embodiment of a process 1000 to accumulate constraints with an option to reconstruct the tableau. In one embodiment, a device executes process 1000 before performing the operations described above in FIGS. 5 and 6. In FIG. 10, process 1000 begins by receiving (at block 1005) an operation request.

At block 1010, process 1000 determines whether the received operation request is a constraint removal request. If the received operation request is a constraint removal request, process 1000 adds (at block 1030) the constraint removal request to a list of pending constraint removal requests. By accumulating these constraint removal requests, the device can later perform these requested constraint removal operations in an order that is more optimal than the order implied by the sequence of receiving these requests, by using the bulk constraint removal operations described above in FIGS. 5 and 6.

Process 1000 determines (at block 1035) whether the list of pending constraint removals has reached a threshold. In one embodiment, the threshold is reached if a ratio between the number of pending constraint removals and the total number of constraints in the tableau of the mathematical programming problem is greater than a pre-determined ratio. For example and in one embodiment, the threshold is reached if the ratio between the number of pending constraint removals and the total number of constraints in the tableau is greater than 0.5.

If the list has not reached the threshold, Process 1000 loops back to block 1005 to receive a new operation request. If the list has reached the threshold, Process 1000 reconstructs (at block 1040) the tableau from constraints that are not being removed, i.e., the constraints that are not pending removal. In one embodiment, if the list of pending constraint removals includes every constraint in the tableau of the mathematical programming problem, instead of reconstructing the tableau from constraints that are not being removed, process 1000 drops the tableau entirely and re-initializes the tableau as empty, i.e., containing no constraints. Process 1000 then ends.

If the received operation request is not a constraint removal request, process 1000 determines (at block 1015) whether the received operation request is a query solution request, constraint addition request, or constraint modification request. If the received operation request is not a query solution request, constraint addition request, or constraint modification request, process 1000 performs (at block 1045) the requested operation. Process 1000 then loops back to block 1005 to receive a new operation request.

If the received operation request is a query solution request, constraint addition request, or constraint modification request, process 1000 removes (at block 1020) all constraints in the list of pending constraint removals. In one embodiment, the operation of block 1020 is the operations described above in FIGS. 5 and 6.

At block 1025, process 1000 performs the requested operation, which is a query solution request, a constraint addition request, or a constraint modification request. Process 1000 then ends.

One of ordinary skill in the art will recognize that process 1000 is a conceptual representation of the operations used to perform bulk constraint removal. The specific operations of process 1000 may not be performed in the exact order shown and described. The specific operations may not be performed in one continuous series of operations, and different specific operations may be performed in different embodiments. For example and in one embodiment, if the received operation request is a constraint addition request and the constraint being added by the request is also pending removal in the list of pending constraint removals, process 1000 simply removes the pending constraint removal for that constraint from the list of pending constraint removals. Furthermore, process 1000 could be implemented using several subprocesses, or as part of a larger macro process. For instance, in some embodiments, the process 1000 is performed by one or more software applications that execute on one or more computers. One of ordinary skill in the art will also recognize that process 1000 can be applied to any method or apparatus of a device for solving a constraint based mathematical programming problem, including but not limited to the simplex method and the incremental simplex method.

Figure 11:
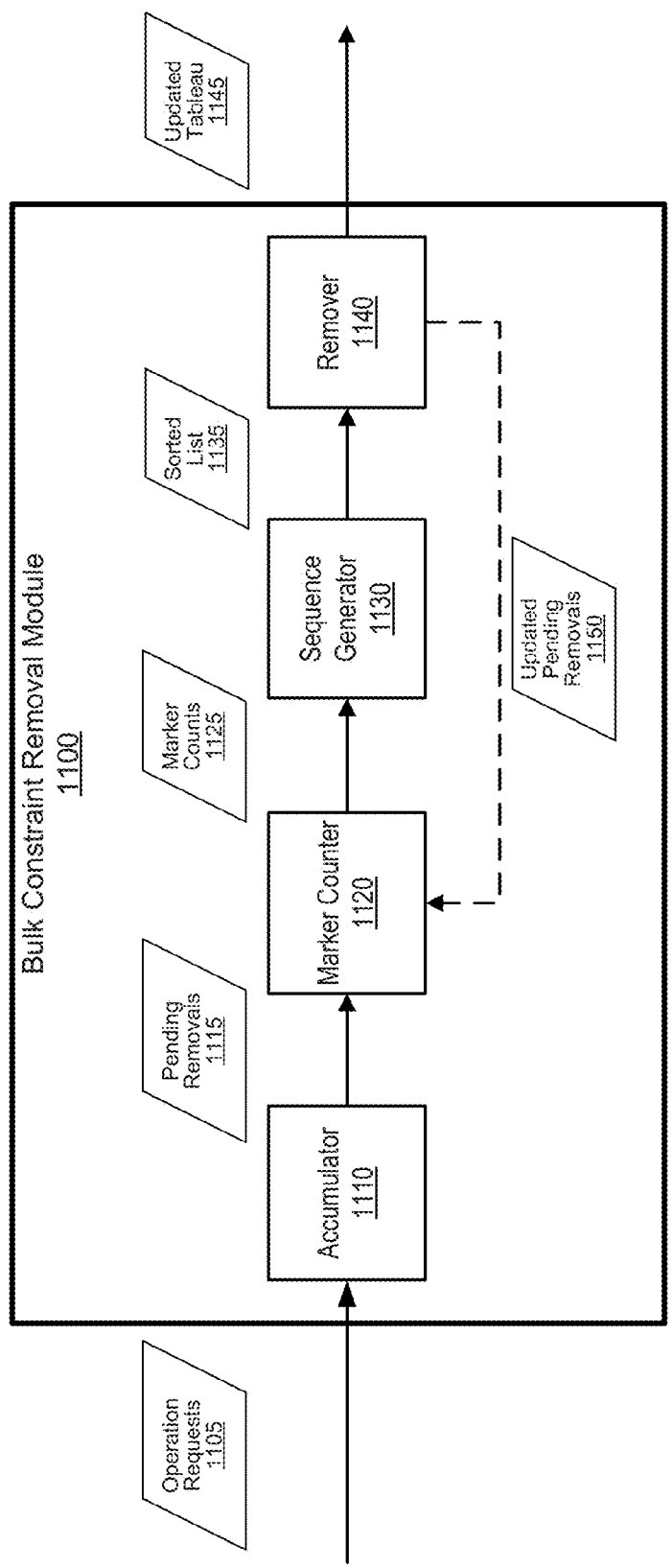
FIG. 11 is a block diagram of a bulk constraint removal module of one embodiment.

FIG. 11 illustrates a detailed diagram of a bulk constraint removal module 1100 of one embodiment. Specifically, this figure illustrates a set of modules for performing bulk constraint removal operations. In one embodiment, the bulk constraint removal module 1100 is used by a device to facilitate the optimization of control layout on a GUI, such as GUI 100 of FIG. 1. As shown in FIG. 11, the bulk constraint removal module 1100 includes an accumulator 1110, a marker counter 1120, a sequence generator 1130, and a remover 1140.

The accumulator 1110 receives operation requests 1105, identifies constraint removal requests among the operation requests 1105, and accumulates identified constraint removal requests for bulk removal later by postponing the execution of the requested constraint removals, as described in FIGS. 7-10 above. The marker counter 1120 receives a list of pending constraint removals 1115 from the accumulator 1110. For each constraint that is pending removal, the marker counter 1120 determines the number of equations containing the marker of the constraint in the mathematical programming problem, as described in FIG. 5, block 510 and FIG. 6, block 610 above.

The sequence generator 1130 receives a marker count 1125 for each constraint that is pending removal from the marker counter 1120. The marker count 1125 represents the number of equations containing the marker of the constraint. The sequence generator 1130 sorts the constraints that are pending removal according to the marker counts 1125 to put the constraints in a sorted order, as described in FIG. 5, block 515 and FIG. 6, block 615 above.

The remover 1140 receives a sorted list of constraints 1135 from the sequence generator 1130. The remover 1140 removes constraints according to the sequence of the sorted list 1135. In one embodiment, the remover 1140 removes all the constraints in the sorted list and generates an updated tableau 1145, as described in FIG. 5, block 520 above. In another embodiment, the remover 1140 removes a subset of constraints in the sorted list and sends an updated list of pending constraint removals 1150 to the marker counter 1120. The marker counter 1120 then re-counts the updated list of pending constraint removals 1150 and the sequence generator 1130 re-sorts the list. The remover 1140 then removes constraints based on the re-sorted list. The cycle continues until all constraints pending removal have been removed, as described in FIG. 6 above.

The bulk constraint removal module 1100 was described above for one embodiment of the invention. One of ordinary skill in the art will realize that in other embodiments this module can be implemented differently. For instance, in one embodiment described above, certain modules are implemented as software modules. However, in another embodiment, some or all of the modules might be implemented by hardware, which can be dedicated application specific hardware (e.g., an ASIC chip or component) or a general purpose chip (e.g., a microprocessor or FPGA).

Figure 12:
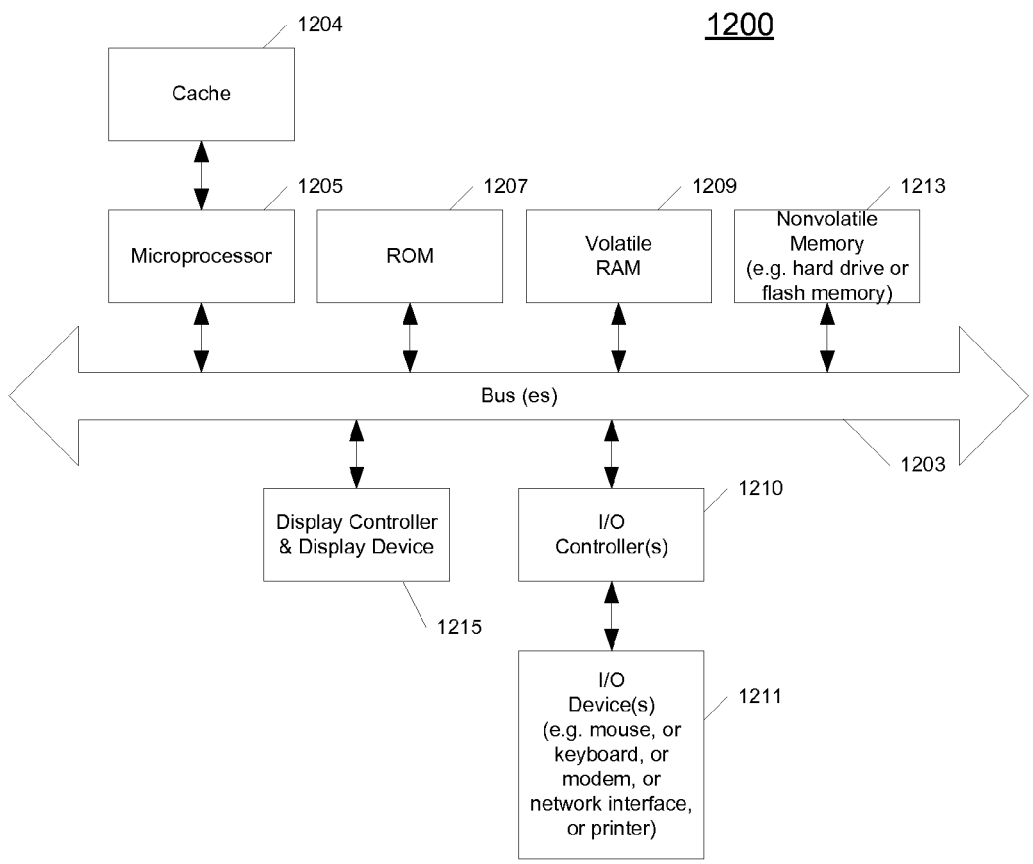
FIG. 12 illustrates one example of a data processing system, which may be used with one embodiment of the present invention.

FIG. 12 shows one example of a data processing system 1200, which may be used with one embodiment of the present invention. Note that while FIG. 12 illustrates various components of a device, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 12, the device 1200, which is a form of a data processing system, includes a bus 1203 which is coupled to a microprocessor(s) 1205 and a ROM (Read Only Memory) 1207 and volatile RAM 1209 and a non-volatile memory 1213. The microprocessor 1205 is coupled to cache memory 1204. Cache memory 1204 may be volatile or non-volatile memory. The microprocessor 1205 may retrieve the instructions from the memories 1207, 1209, 1213, and 1204 and execute the instructions to perform operations described above. The bus 1203 interconnects these various components together and also interconnects these components 1205, 1207, 1209, and 1213 to a display controller and display device 1215 and to peripheral devices such as input/output (I/O) devices which may be mice, keyboards, modems, network interfaces, printers and other devices which are well known in the art. Typically, the input/output devices 1211 are coupled to the system through input/output controllers 1210. The volatile RAM (Random Access Memory) 1209 is typically implemented as dynamic RAM (DRAM), which requires power continually in order to refresh or maintain the data in the memory.

The mass storage 1213 is typically a magnetic hard drive or a magnetic optical drive or an optical drive or a DVD RAM or a flash memory or other types of memory systems, which maintain data (e.g. large amounts of data) even after power is removed from the system. Typically, the mass storage 1213 will also be a random access memory although this is not required. While FIG. 12 shows that the mass storage 1213 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 1203 may include one or more buses connected to each other through various bridges, controllers and/or adapters as is well known in the art.

Figure 13:
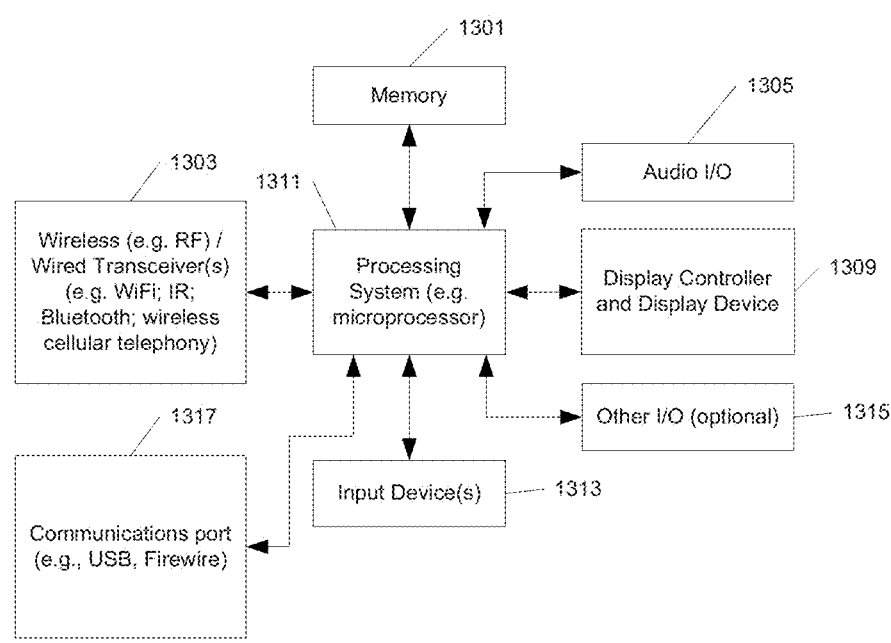
FIG. 13 illustrates one example of another data processing system, which may be used with one embodiment of the present invention.

FIG. 13 shows an example of another data processing system 1300 which may be used with one embodiment of the present invention. The data processing system 1300 shown in FIG. 13 includes a processing system 1311, which may be one or more microprocessors, or which may be a system on a chip integrated circuit, and the system also includes memory 1301 for storing data and programs for execution by the processing system. The system 1300 also includes an audio input/output subsystem 1305, which may include a microphone and a speaker, for example, for playing back music or providing telephone functionality through the speaker and microphone.

A display controller and display device 1309 provide a visual user interface for the user; this digital interface may include a graphical user interface which is similar to that shown on a Macintosh computer when running OS X operating system software, or Apple iPhone when running the iOS operating system, etc. The system 1300 also includes one or more wireless transceivers 1303 to communicate with another data processing system, such as the system 1300 of FIG. 13. A wireless transceiver may be a WLAN transceiver, an infrared transceiver, a Bluetooth transceiver, and/or a wireless cellular telephony transceiver. It will be appreciated that additional components, not shown, may also be part of the system 1300 in certain embodiments, and in certain embodiments fewer components than shown in FIG. 13 may also be used in a data processing system. The system 1300 further includes one or more communication ports 1317 to communicate with another data processing system, such as the system in FIG. 12. The communication port may be a USB port, Firewire port, Bluetooth interface, etc.

The data processing system 1300 also includes one or more input devices 1313, which are provided to allow a user to provide input to the system. These input devices may be a keypad or a keyboard or a touch panel or a multi touch panel. The data processing system 1300 also includes an optional input/output device 1315 which may be a connector for a dock. It will be appreciated that one or more buses, not shown, may be used to interconnect the various components as is well known in the art. The data processing system shown in FIG. 13 may be a handheld device or a personal digital assistant (PDA), or a cellular telephone with PDA like functionality, or a handheld device which includes a cellular telephone, or a media player, such as an iPod, or devices which combine aspects or functions of these devices, such as a media player combined with a PDA and a cellular telephone in one device or an embedded device or other consumer electronic devices. In other embodiments, the data processing system 1300 may be a network computer or an embedded processing device within another device, or other types of data processing systems, which have fewer components or perhaps more components than that shown in FIG. 13.

At least certain embodiments of the inventions may be part of a digital media player, such as a portable music and/or video media player, which may include a media processing system to present the media, a storage device to store the media and may further include a radio frequency (RF) transceiver (e.g., an RF transceiver for a cellular telephone) coupled with an antenna system and the media processing system. In certain embodiments, media stored on a remote storage device may be transmitted to the media player through the RF transceiver. The media may be, for example, one or more of music or other audio, still pictures, or motion pictures.

The portable media player may include a media selection device, such as a click wheel input device on an iPod® or iPod Nano® media player from Apple, Inc. of Cupertino, Calif., a touch screen input device, pushbutton device, movable pointing input device or other input device. The media selection device may be used to select the media stored on the storage device and/or the remote storage device. The portable media player may, in at least certain embodiments, include a display device which is coupled to the media processing system to display titles or other indicators of media being selected through the input device and being presented, either through a speaker or earphone(s), or on the display device, or on both display device and a speaker or earphone(s). Examples of a portable media player are described in published U.S. Pat. Nos. 7,345,671 and 7,627,343, both of which are incorporated herein by reference.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose device selectively activated or reconfigured by a computer program stored in the device. Such a computer program may be stored in a computer readable storage medium, such as, but not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a device bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "sorting," "re-sorting," "performing," "removing," "determining," "selecting," "accumulating," "reconstructing," "re-initializing," "identifying," "detecting," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A method of removing constraints in optimizing layout of a graphical user interface (GUI) displayed on a display device, the method comprising:
   accumulating a plurality of constraint removal requests based upon a change of the GUI, until an occurrence of an event;
   in response to the occurrence of the event, identifying a plurality of constraints, each having a marker, for bulk removal from a constraint collection based on a change of the GUI, wherein a constraint in the constraint collection constrains at least one of a size or a position of a user interface element of the GUI, the constraint collection defining a layout of elements of the GUI on the display device;
   sorting the plurality of constraints in an order based on a count of occurrences of each marker, or for each marker, a count of equations having the marker in an optimization layout of the GUI, to put the plurality of constraints in a sorted order;
   performing bulk constraint removal on the plurality of constraints based on the sorted order, lowest count first; and
   displaying the GUI with an updated layout on the display device according to the updated constraint collection.

2. The method of claim 1, wherein the identifying of the plurality of constraints for bulk removal comprises:
   accumulating constraint removal requests by postponing execution of the constraint removal requests until receiving one of a query solution request, a constraint addition request, or a constraint modification request; and
   identifying constraints corresponding to the accumulated constraint removal requests for bulk removal when one of a query solution request, a constraint addition request, and a constraint modification request is received.

3. The method of claim 2, wherein the accumulating of the constraint removal requests comprises:
   receiving a constraint removal request based on the change of the GUI;
   determining whether the received constraint removal request satisfies a set of accumulation criteria; and
   accumulating the received constraint removal request by postponing the execution of the received constraint removal request when the constraint removal request satisfies the set of accumulation criteria.

4. The method of claim 3, wherein the set of accumulation criteria comprises the constraint corresponding to the constraint removal request appearing in more than a pre-defined number of equations in a mathematical programming problem that represents the layout of the GUI.

5. The method of claim 2, wherein the method further comprises:
   determining whether a number of the accumulated constraint removal requests has reached a capacity threshold; and
   identifying constraints corresponding to the accumulated constraint removal requests for bulk removal when the number of the accumulated constraint removal requests has reached the capacity threshold.

6. The method of claim 2, wherein the method further comprises:
   determining whether a number of the accumulated constraint removal requests against a total number of constraints in the constraint collection has reached a ratio threshold; and
   reconstructing equations in a mathematical programming problem from constraints that are not being removed when the number of the accumulated constraint removal requests against the total number of constraints in the constraint collection has reached the ratio threshold, the mathematical programming problem representing the layout of the GUI.

7. The method of claim 2, wherein the method further comprises:
   determining whether the accumulated constraint removal requests contain all constraints in the constraint collection; and
   re-initializing a mathematical programming problem as having no constraint when the accumulated constraint removal requests contain all constraints in the constraint collection.

8. The method of claim 2, wherein the identifying of the constraints for bulk removal comprises:
   receiving a constraint addition request;
   determining whether a constraint corresponding to the received constraint addition request is involved in an accumulated constraint removal request; and
   removing an accumulated constraint removal request from accumulation when the constraint corresponding to the received constraint addition request is involved in the accumulated constraint removal request.

9. The method of claim 1, further comprising:
   marking a constraint for which a removal request is received, with a marker variable;
   accumulating constraint removal requests by postponing execution of the constraint removal requests until the marker variable appears in more than a pre-defined number of equations in a mathematical programming problem that optimizes the layout of the GUI displayed on the display device.

10. The method of claim 1, wherein the event comprises one of:
    the number of accumulated remove constraint requests exceeds a threshold value;
    receiving of a solve layout optimization request;
    receiving of an add constraint request; or
    receiving of a modify constraint request.

11. A non-transitory computer-readable medium programmed with executable instructions, that when executed by a processing system, performs a method of removing constraints in optimizing layout of a graphical user interface (GUI) displayed on a display device, the method comprising:
    accumulating a plurality of constraint removal requests based upon a change of the GUI, until an occurrence of an event;
    in response to the occurrence of the event, identifying a plurality of constraints, each having a marker, for bulk removal from a constraint collection based on a change of the GUI, wherein a constraint in the constraint collection constrains at least one of a size or a position of a user interface element of the GUI, the constraint collection defining a layout of elements of the GUI on the display device;
    sorting the plurality of constraints in an order based on a count of occurrences of each marker, or for each marker, a count of equations having the marker in an optimization layout of the GUI, to put the plurality of constraints in a sorted order;
    performing bulk constraint removal on the plurality of constraints based on the sorted order, lowest count first; and
    displaying the GUI with an updated layout on the display device according to the updated constraint collection.

12. The medium of claim 11, wherein the identifying of the plurality of constraints for bulk removal comprises:
    accumulating constraint removal requests by postponing execution of the constraint removal requests until receiving one of a query solution request, a constraint addition request, or a constraint modification request; and
    identifying constraints corresponding to the accumulated constraint removal requests for bulk removal when one of a query solution request, a constraint addition request, and a constraint modification request is received.

13. The medium of claim 12, wherein the accumulating of the constraint removal requests comprises:
    receiving a constraint removal request based on the change of the GUI;
    determining whether the received constraint removal request satisfies a set of accumulation criteria; and
    accumulating the received constraint removal request by postponing the execution of the received constraint removal request when the constraint removal request satisfies the set of accumulation criteria.

14. The medium of claim 13, wherein the set of accumulation criteria comprises the constraint corresponding to the constraint removal request appearing in more than a pre-defined number of equations in a mathematical programming problem that represents the layout of the GUI.

15. The medium of claim 12, wherein the method further comprises:
    determining whether a number of the accumulated constraint removal requests has reached a capacity threshold; and identifying constraints corresponding to the accumulated constraint removal requests for bulk removal when the number of the accumulated constraint removal requests has reached the capacity threshold.

16. The medium of claim 12, wherein the method further comprises:
   determining whether a number of the accumulated constraint removal requests against a total number of constraints in the constraint collection has reached a ratio threshold; and
   reconstructing equations in a mathematical programming problem from constraints that are not being removed when the number of the accumulated constraint removal requests against the total number of constraints in the constraint collection has reached the ratio threshold, the mathematical programming problem representing the layout of the GUI.

17. The medium of claim 12, wherein the method further comprises:
   determining whether the accumulated constraint removal requests contain all constraints in the constraint collection; and
   re-initializing a mathematical programming problem as having no constraint when the accumulated constraint removal requests contain all constraints in the constraint collection.

18. The medium of claim 12, wherein the identifying of the constraints for bulk removal comprises:
   receiving a constraint addition request;
   determining whether a constraint corresponding to the received constraint addition request is involved in an accumulated constraint removal request; and
   removing an accumulated constraint removal request from accumulation when the constraint corresponding to the received constraint addition request is involved in the accumulated constraint removal request.

19. An electronic device comprising a processing system coupled to a memory programmed with executable instructions that, when executed by the processing system, performs a method of removing constraints in optimizing layout of a graphical user interface (GUI) displayed on a display device, the method comprising:
   accumulating a plurality of constraint removal requests based upon a change of the GUI, until an occurrence of an event;
   in response to the occurrence of the event, identifying a plurality of constraints, each having a marker, for bulk removal from a constraint collection based on a change of the GUI, wherein a constraint in the constraint collection constrains at least one of a size or a position of a user interface element of the GUI, the constraint collection defining a layout of elements of the GUI on the display device, the layout including at least one of size or position of the elements of the GUI on the display;
   sorting the plurality of constraints in an order based on a count of occurrences of each marker, or for each marker, a count of equations having the marker in an optimization layout of the GUI, to put the plurality of constraints in a sorted order;
   performing bulk constraint removal on the plurality of constraints based on the sorted order, lowest count first; and
   displaying the GUI with an updated layout on the display device according to the updated constraint collection.

20. The device claim 19, wherein the identifying of the plurality of constraints for bulk removal comprises:
   accumulating constraint removal requests by postponing execution of the constraint removal requests until receiving one of a query solution request, a constraint addition request, or a constraint modification request; and
   identifying constraints corresponding to the accumulated constraint removal requests for bulk removal when one of a query solution request, a constraint addition request, and a constraint modification request is received.

21. The device of claim 20, wherein the accumulating of the constraint removal requests comprises:
   receiving a constraint removal request based on the change of the GUI;
   determining whether the received constraint removal request satisfies a set of accumulation criteria; and
   accumulating the received constraint removal request by postponing the execution of the received constraint removal request when the constraint removal request satisfies the set of accumulation criteria.

22. The device of claim 21, wherein the set of accumulation criteria comprises the constraint corresponding to the constraint removal request appearing in more than a predefined number of equations in a mathematical programming problem that represents the layout of the GUI.

23. The device of claim 20, wherein the method further comprises:
   determining whether a number of the accumulated constraint removal requests has reached a capacity threshold; and
   identifying constraints corresponding to the accumulated constraint removal requests for bulk removal when the number of the accumulated constraint removal requests has reached the capacity threshold.

24. The device of claim 20, wherein the method further comprises:
   determining whether a number of the accumulated constraint removal requests against a total number of constraints in the constraint collection has reached a ratio threshold; and
   reconstructing equations in a mathematical programming problem from constraints that are not being removed when the number of the accumulated constraint removal requests against the total number of constraints in the constraint collection has reached the ratio threshold, the mathematical programming problem representing the layout of the GUI.

25. The device of claim 20, wherein the method further comprises:
   determining whether the accumulated constraint removal requests contain all constraints in the constraint collection; and
   re-initializing a mathematical programming problem as having no constraint when the accumulated constraint removal requests contain all constraints in the constraint collection.

26. The device of claim 20, wherein the identifying of the constraints for bulk removal comprises:
   receiving a constraint addition request;
   determining whether a constraint corresponding to the received constraint addition request is involved in an accumulated constraint removal request; and
   removing an accumulated constraint removal request from accumulation when the constraint corresponding to the received constraint addition request is involved in the accumulated constraint removal request.

\* \* \* \* \*